(12) United States Patent
Nguyen et al.

(10) Patent No.: US 10,742,219 B1
(45) Date of Patent: Aug. 11, 2020

(54) PROGRAMMABLE MODULAR FREQUENCY DIVIDER

(71) Applicant: BAE Systems Imaging Solutions Inc., San Jose, CA (US)

(72) Inventors: Khai Nguyen, Stockton, CA (US); Andrew C. Ng, Oakland, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 0 days.

(21) Appl. No.: 16/400,019

(22) Filed: Apr. 30, 2019

(51) Int. Cl.
| H03K 21/02 | (2006.01) |
| H03K 3/037 | (2006.01) |
| G06F 1/06 | (2006.01) |
| G06F 1/10 | (2006.01) |
| H03K 19/20 | (2006.01) |

(52) U.S. Cl.
CPC ............... *H03K 21/02* (2013.01); *G06F 1/06* (2013.01); *G06F 1/10* (2013.01); *H03K 3/037* (2013.01); *H03K 19/20* (2013.01)

(58) Field of Classification Search
None
See application file for complete search history.

(56) References Cited

U.S. PATENT DOCUMENTS

| 8,775,856 B1 * | 7/2014 | An .......................... G06F 1/06 713/400 |
| 2008/0258781 A1 * | 10/2008 | Song .................... H03K 23/425 327/117 |
| 2013/0082748 A1 * | 4/2013 | Karalar ................ H03K 21/023 327/115 |
| 2014/0003569 A1 * | 1/2014 | Martin ................... H03K 21/08 377/48 |
| 2014/0312936 A1 * | 10/2014 | Abdel-Haleem ....... H03L 7/193 327/118 |
| 2018/0054203 A1 * | 2/2018 | Drost ..................... H03K 21/38 |
| 2018/0109266 A1 * | 4/2018 | Gupta .................. H03L 7/1974 |

OTHER PUBLICATIONS

International Search Report, PCT/US2020/029519 dated May 22, 2020, 6 pages.

* cited by examiner

*Primary Examiner* — Cassandra F Cox
(74) *Attorney, Agent, or Firm* — Calvin B. Ward; Scott J. Asmus (57) ABSTRACT

A frequency divider includes a circuit that receives an input clock signal having a period T on an input port thereof and generates an output clock signal on an output port thereof having a period MT in response to a control signal specifying M is disclosed. Here, M is a positive integer and all transitions between logical one and logical zero in the output clock signal occur at integer multiples of T. In one embodiment, the circuit includes a module string having characterized by N identical modules connected in series to form a string of modules. Each module is configured such that when the clock signal having period T is input to the first module, the output clock signal having a period of MT is output from the last module, where M can have any value between one and a maximum number that depends on N.

10 Claims, 6 Drawing Sheets

PROGRAMMABLE MODULAR FREQUENCY DIVIDER

BACKGROUND OF THE INVENTION

Many electronic circuits utilize frequency dividers to generate a secondary signal from a primary signal in which the primary signal has a frequency that is an integer multiple of the secondary signal. It would be advantageous to be able to provide a circuit that can perform the integer division for any divisor between one and some predetermined upper limit.

SUMMARY

The present disclosure provides a frequency divider which includes a circuit that receives an input clock signal having a period T on an input port thereof and generates an output clock signal on an output port thereof having a period MT in response to a control signal specifying M. Here, M is a positive integer and all transitions between logical one and logical zero in the output clock signal occur at integer multiples of T.

In one aspect, the circuit includes a module string having characterized by N identical modules connected in series to form a string of modules having a first module, a last module, and N>1, each module is characterized by a module input clock port, a module output clock port, a module division control port, and an inter-module input port.

In one aspect, the maximum number is $2^N$.

In one aspect, each module, when not connected to another one of the modules, performs a frequency division of one, two, or three, depending on an input to the module division control port of that module, the module input clock port is shorted to the module output clock port of that module when the module division control port of that module receives an input indicating a division by one is to occur.

In one aspect, the module performs a frequency division of three if the module division control port of that module receives an input indicating a division by three and the inter-module input port of the module is connected to a predetermined constant potential.

In one aspect, the frequency divider includes a controller that generates and couples a module division control port input signal to each of the modules in response to a configuration input that specifies a value for M.

In one aspect, each module is configured such that any module that receives a control division port input indicating of a division by three when an input signal to that module has a period, t, can only provide an output signal having period of 3t once in every MT cycles.

DETAILED DESCRIPTION

Figure 1:
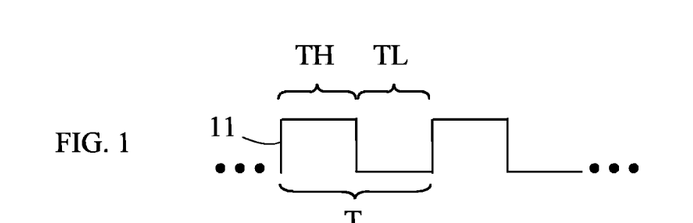
FIG. 1 illustrates the typical clock signal.

Refer now to FIG. 1, which illustrates the typical clock signal. For the purposes of this application, a clock signal will be defined to be a repeating binary signal that switches between a voltage corresponding to a logical one and a voltage corresponding to a logical zero. There is only one transition from logical zero to logical one and only one transition from logical one to logical zero within each cycle of the clock signal. A cycle begins on either a rising edge, i.e., a transition from logical zero to logical one, or a falling edge, i.e., a transition from logical one to logical zero. The example shown in FIG. 1 includes two cycles of such a clock signal. To simplify the following discussion, the repeating waveform will be assumed to begin on the rising edge 11 of the signal. That is, the transition from a logical zero to a logical one. At some point during the binary signal, the voltage level will again return to that corresponding to a logical zero. Each cycle is characterized by a time period, T, consisting of a sub-period, TH, in which the signal is at logical one and a sub-period, TL, at which the signal is at logical zero. However, the fraction of the cycle time at which the repeating waveform spends at a logical one need not be equal to the fraction of the time the repeating waveform spends at logical zero. The frequency of the clock signal is defined to be the inverse of the period of the signal, i.e., 1/T. It should be noted that a clock signal resulting from dividing a first clock signal having a period of T by three has a period of 3T, but not necessarily the same ratio of TH/TL of the first clock signal.

For many applications of interest, the leading edge of the clock signal is used for timing purposes and the remainder of the clock signal waveform is less important. In these applications, it is also advantageous to generate a secondary clock signal that has a frequency, 1/(nT), where n is an integer. In principle, such a signal could be created by increasing the sub-periods, TH and TL, by a factor of n. However, this option presents challenges for some value of n. For example, consider the case in which n=3. In the example shown in FIG. 1, TH and TL would need to be increased from T/2 to 3T/2. Providing the timing for the one to zero transitions presents challenges, since there is no clock signal with a rising edge at half of T.

The present integer division circuit makes use of the observation that the original signal provides precise timing for transitions at times kT, where k is an integer. Hence, by increasing TH such that the transition to zero occurs at a multiple of T with respect to the start of the waveform, precise timing of the one to zero transition is obtained. In addition, the waveform at nT is a time provided by the original signal rising edge.

Figure 2:
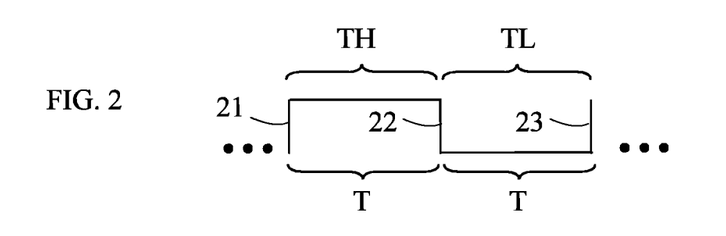
FIG. 2 illustrates the waveform for the case in which the division of the original frequency is by a factor of two.

Refer now to FIG. 2, which illustrates the waveform for the case in which the division of the original frequency is by a factor of two. The waveform starts with the rising edge shown at 21. The total length of the waveform is 2T as shown at 23. The internal transition from one to zero takes place at T after the start of the waveform as shown at 22. In this example, the sub-periods TH and TL are the same length; however, that is not always the case for all values on n.

Figure 3:
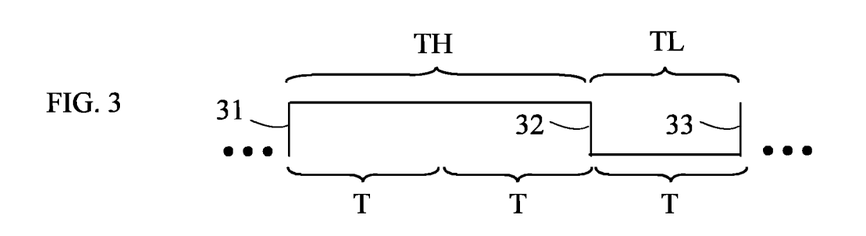
FIG. 3 illustrates the waveform for the case in which the division of the original frequency is by a factor of three.

Refer to now FIG. 3, which illustrates the waveform for the case in which the division of the original frequency is by a factor of three. The waveform starts with the rising edge shown at 31. The total length of the waveform is 3T as shown at 33. The internal transition from one to zero takes place at 2T after the start of the waveform as shown at 32. In this example, the sub-period TH is twice as long as the sub-period TL.

In one aspect of the frequency divider, the frequency divider is constructed from one or more identical modules that are connected in series. Each module includes a module input clock port and a module output clock port. The output clock port provides a clock signal that has a period that is one, two, or three times the period of the clock signal on the module input clock port. Each module also includes a module division control port that specify which of the three periods is to be used for the output. Each module includes two ports that are used for interconnecting the modules in the string of modules. These ports will be referred to as inter-module input and output ports. To simplify the notation, these inter-module ports will be referred to as $MOD_{in}$ and $MOD_{out}$. These inter-module ports are used in connecting the modules together to provide a clock period having integer multipliers greater than three. It should be noted that the $MOD_{in}$ input is one of the control inputs that determine whether the output signal has a period of two or three relative to the input signal.

To simplify the following discussion, it will be assumed that periods of the signals are measured relative to the leading edges of the clock signal. Embodiments in which the falling edges are used instead will be apparent from the following discussion. If the control inputs indicate an output period of one times the input period, the input clock terminal is shorted to the output clock terminal.

To simplify the discussion, a logical level of one will be assumed to correspond to a HIGH positive voltage, and a logical level of zero will be assumed to correspond to a LOW voltage that is less than HIGH. If the output terminal is LOW when the next edge is received at the input terminal, the output terminal is set to HIGH on receiving the edge at the input terminal if the control input indicates division by two or three, i.e., an output signal having a period of 2T or 3T. If the control input specifies division by two, the signal on the output terminal will be set to LOW on the receipt of the next edge at the input terminal. In this case, the output waveform will repeat at the following input edge.

If the control inputs indicate that the output period is to be three times the input period, the signal on the output terminal will be set to HIGH for one more input signal time period when the next input edge is received. On receiving another input edge after this second HIGH period, the signal on the output terminal will be set LOW, and the output waveform consisting of two HIGH input clock periods and one LOW input clock period will repeat at the edge following the transition from HIGH to LOW.

Figure 4:
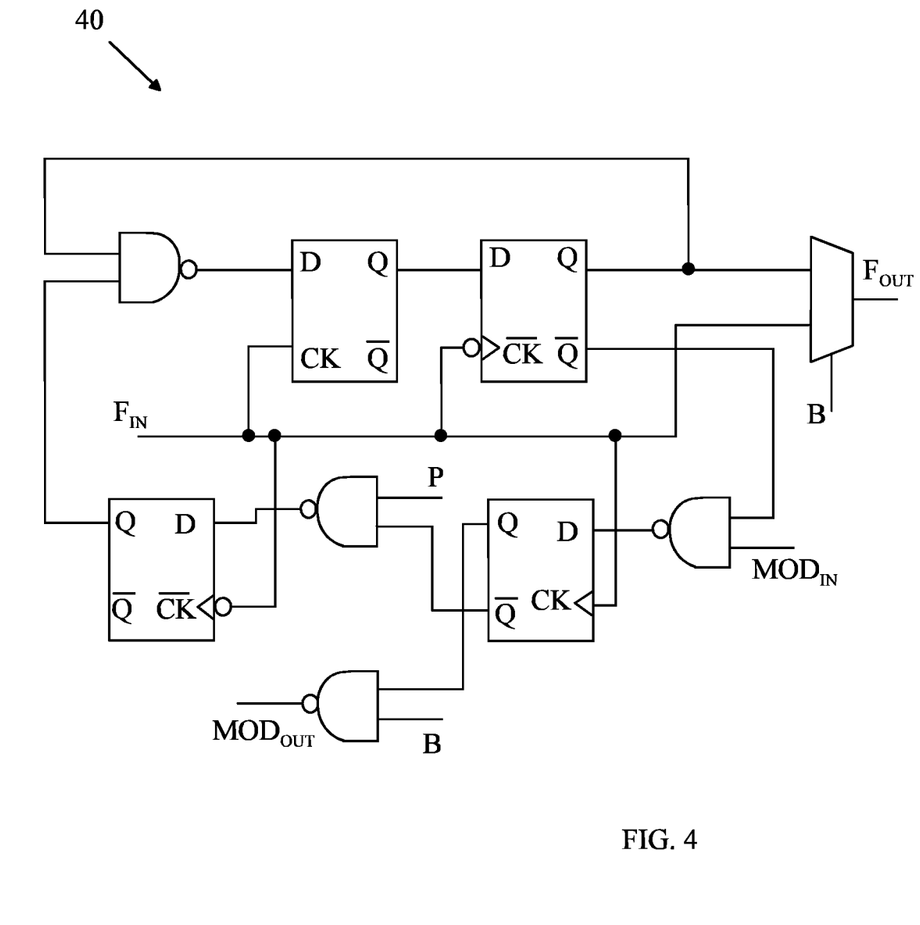
FIG. 4 illustrates one embodiment of the module discussed.

Refer now to FIG. 4, which illustrates one embodiment of the module discussed above. Module 40 provides an output period of one, two, or three times the period of the clock input signal depending on the signals provided at B and P. The division by one is useful in setting the overall frequency division in a series string of a plurality of such modules.

The "MOD" input/output signals are required for a frequency divider constructed from a chain of modules. To divide by three, both P and $MOD_{in}$ must have the appropriate values at the beginning of the output cycle. In a divide-by-three mode, an extra high period is inserted into the output signal. For a frequency divider having a single module, the "$MOD_{in}$" signal is tied to HIGH, and the value of P determines whether the module is in divide-by-three or divide-by-two mode. The control signals that specify the divisor consist of two signal lines, shown at B and P in addition to $MOD_{in}$. If the B signal is LOW, the module is bypassed for an effective division by one. If the B signal is HIGH and the P signal is LOW, the module is in "divide-by-two" mode. If the B signal is HIGH, the P signal is also HIGH, and $MOD_{in}$ is also HIGH, module 40 is in "divide-by-three" mode. That is, module 40 inserts one extra high period into the waveform such that the period of the output signal is three times the period of the input signal.

This triple divider module capability allows programmable N-bit integer frequency division to be implemented in a truly modular fashion since each module in the chain is identical. If the divisor, $N_{div}$, is greater than three, the circuit must include a plurality of modules connected in series.

Figure 5:
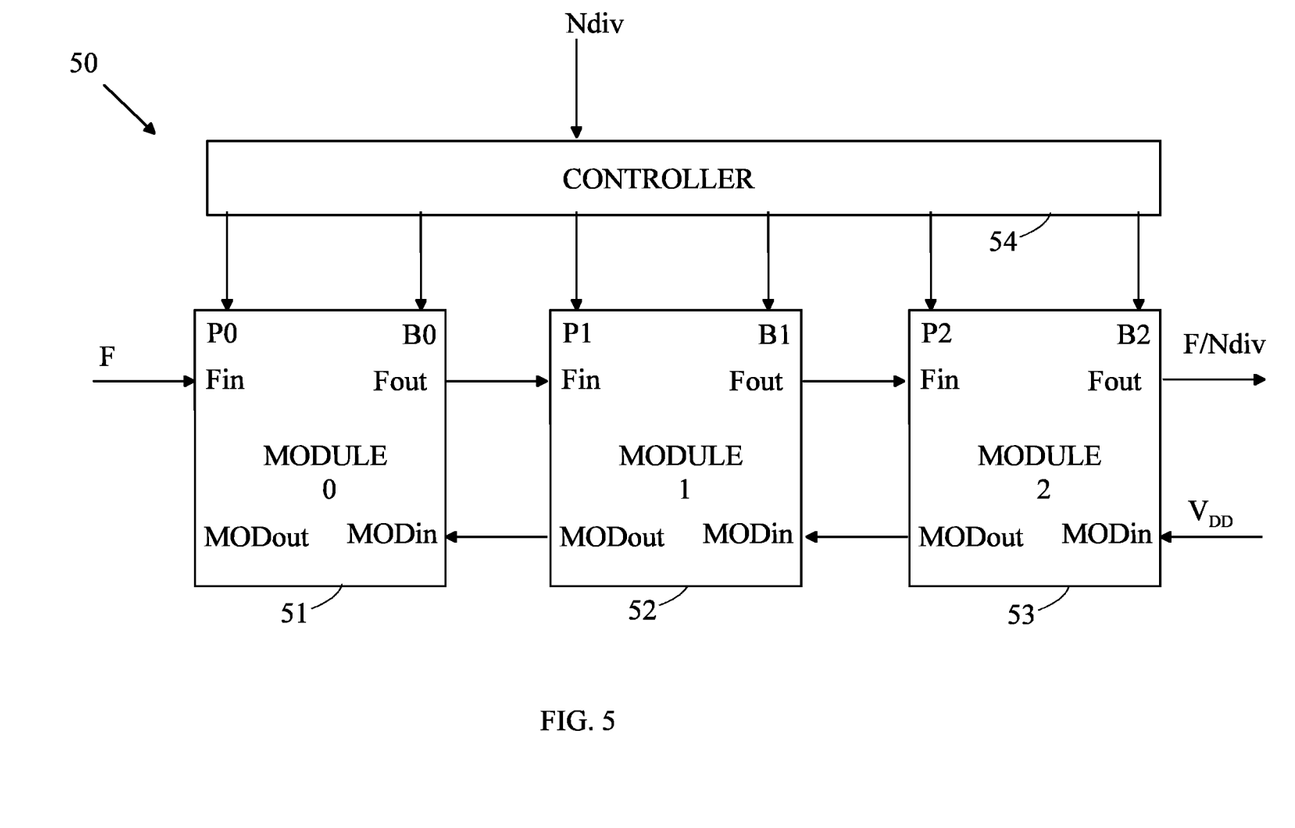
FIG. 5 illustrates a frequency divider comprising three modules.

The manner in which a multi-modulus frequency divider operates can be more easily understood with reference to an exemplary frequency divider having three modules connected in series. Such a frequency divider can provide division by factors of one through eight. Refer now to FIG. 5, which illustrates a frequency divider 50 comprising three modules. Frequency divider 50 provides divisors of one through eight. The specific divisor is set by inputting a three-bit control value, $N_{div}$, to controller 54. In embodiments utilizing a fixed divisor, the P and B inputs can be hardwired and controller 54 omitted.

The three modules are shown at 51-53. The $F_{out}$ from module 51 is connected to the $F_{in}$ of module 52, and the $F_{out}$ of module 52 is connected to the $F_{in}$ of module 53. A signal having a frequency of F is input to the $F_{in}$ of module 51, and the output of module 53 provides a signal with a frequency of $F/N_{div}$. The $MOD_{in}$ of module 53 is connected to $V_{DD}$, which is assumed to be logical one. The $MOD_{out}$ of module 53 is connected to the $MOD_{in}$ of module 52. The $MOD_{out}$ of module 52 is connected to the $MOD_{in}$ of module 51.

Denote the period of the input to module 51 by T. Denote the period of the $F_{out}$ signal from module 53 by the "$T_{out}$", i.e., $T_{out}=N_{div}*T$. The importance of $T_{out}$ will be discussed in more detail below.

Refer now to Table 1, which illustrates the values for the B and P variables for each of the modules for each of the possible $N_{div}$ values. In this example, the desired $N_{div}$ value is specified by a three-bit integer, $N_{div}$, that is input to controller 54.

TABLE 1

| | $N_{div}$ | $N_{div}$ | $N_{div}$ | MODULE 0 | | MODULE 1 | | MODULE 2 | |
|---|---|---|---|---|---|---|---|---|---|
| $N_{div}$ | Bit 2 | Bit 1 | Bit 0 | $B_0$ | $P_0$ | $B_1$ | $P_1$ | $B_2$ | $P_2$ |
| 1 | 0 | 0 | 0 | 0 | 1 | 0 | 0 | 0 | 0 |
| 2 | 0 | 0 | 1 | 1 | 0 | 0 | 1 | 0 | 0 |
| 3 | 0 | 1 | 0 | 1 | 1 | 0 | 1 | 0 | 0 |
| 4 | 0 | 1 | 1 | 1 | 0 | 1 | 0 | 0 | 1 |
| 5 | 1 | 0 | 0 | 1 | 1 | 1 | 0 | 0 | 1 |
| 6 | 1 | 0 | 1 | 1 | 0 | 1 | 1 | 0 | 1 |
| 7 | 1 | 1 | 0 | 1 | 1 | 1 | 1 | 0 | 1 |
| 8 | 1 | 1 | 1 | 1 | 0 | 1 | 0 | 1 | 0 |

Figure 6A:
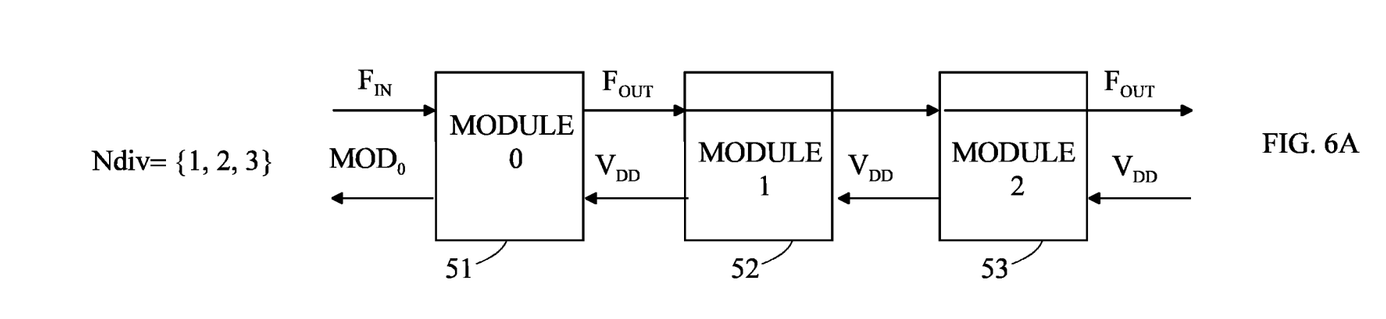
FIGS. 6A-6C illustrate the physical connections between modules 51-53 or various ranges of $N_{div}$ values.
Figure 6B:
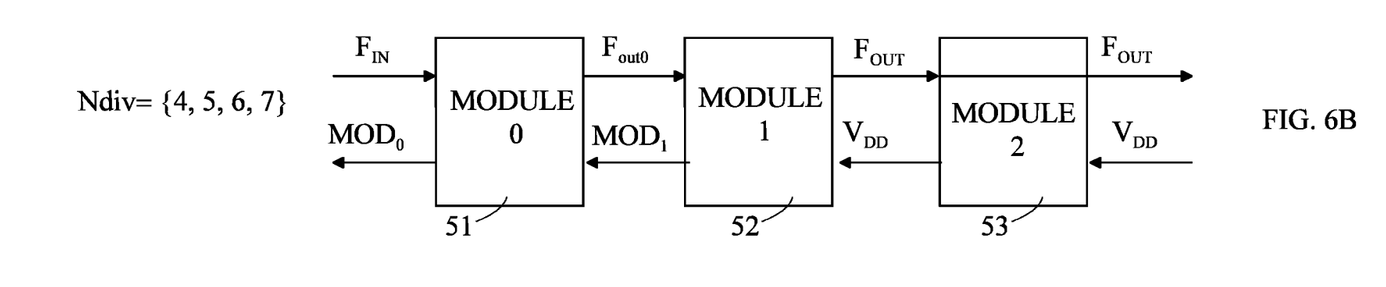
Figure 6C:
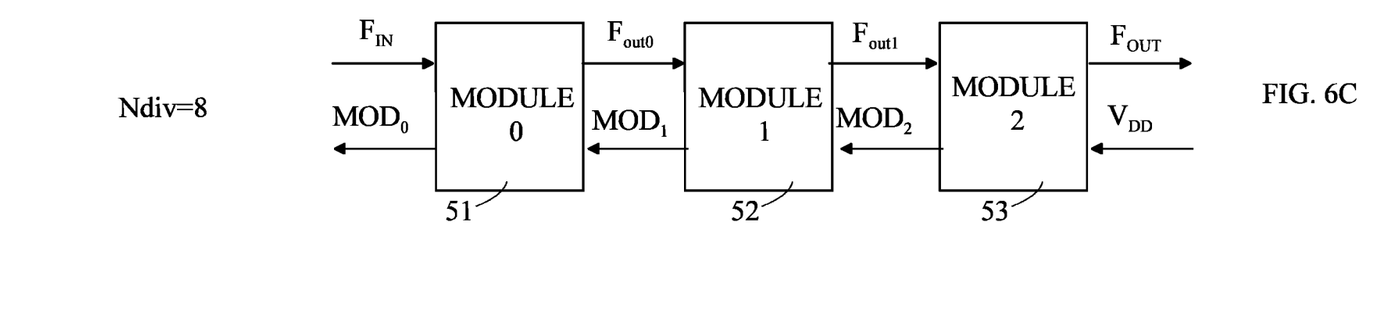

Refer now to FIGS. 6A-6C, which illustrate the physical connections between modules 51-53 or various ranges of $N_{div}$ values. To simplify the drawings, the connections for the B and P inputs to the modules and the controller have been omitted. For $N_{div}$ of less than four, only module 51 is used as shown in FIG. 6A. Modules 52 and 53 are set to divide-by-one mode and $MOD_{in}$ for module 51 is connected to $V_{DD}$. For $N_{div}$ values of four through seven, modules 51 and 52 are used and module 53 is placed in divide-by-one mode as shown in FIG. 6B. In this case, the $MOD_{in}$ input to module 52 is connected to $V_{DD}$, and the $MOD_{in}$ input to module 51 is connected to the $MOD_{out}$ port of module 52. For an $N_{div}=8$, all three modules are used as shown in FIG. 6C.

In general, if there is an ordered serial string of N modules, 0, 1, . . . N−1, the clock signal to be divided is input to the module 0 and the clock output of module k is connected to clock input of module k+1 for k=0 to N−2. The $MOD_{in}$ port of module k is connected to either logical one or the $MOD_{out}$ port of module k+1, for k=0 to N−2. The choice of connection for the $MOD_{in}$ port depends on the specific value of $N_{div}$ being implemented. In general, lower values of $N_{div}$ are implemented in lower module numbers in the chain with the high module numbers being configured in the divide-by-one mode in which $MOD_{in}$ is tied to $V_{DD}$. If the last module that is not in divide-by-one mode is module L, then the $MOD_{in}$ for all modules numbers L through N−1 are connected to $V_{DD}$, and the $MOD_{in}$ port of module k is connected to the $MOD_{out}$ port of module k+1 for k=0 to L−2.

While $F_{in}$ and $F_{out}$ are clock signals, as defined above, the intermediate output signals, $F_{out0}$, $F_{out1}$, . . . , may not be clock signals as defined above. Consider the case in which $N_{div}$ is an odd number greater than three. To arrive at such an odd number, one of the modules must be in divide-by-three mode to arrive at a $T_{out}$ that is odd. However, if that module inserts three periods twice during $T_{out}$, then that module's contribution to $T_{out}$ will be even, and hence, the ability to reach an odd value for $N_{div}$ would be lost.

The $MOD_{in}$-$MOD_{out}$ feedback chain prevents any module that has P and B values set to provide a period of three times the input period to that module from inserting the additional period that converts a times two period into a times three period more than once during $T_{out}$. This veto of an attempt to insert the extra period more than once can give rise to an $F_{out}$ signal that is not a clock signal within the above definition. However, when the $F_{out}$ in question is finally transformed to $F_{out}$, the $F_{out}$ signal will be a clock signal according to the above definition.

Figure 7:
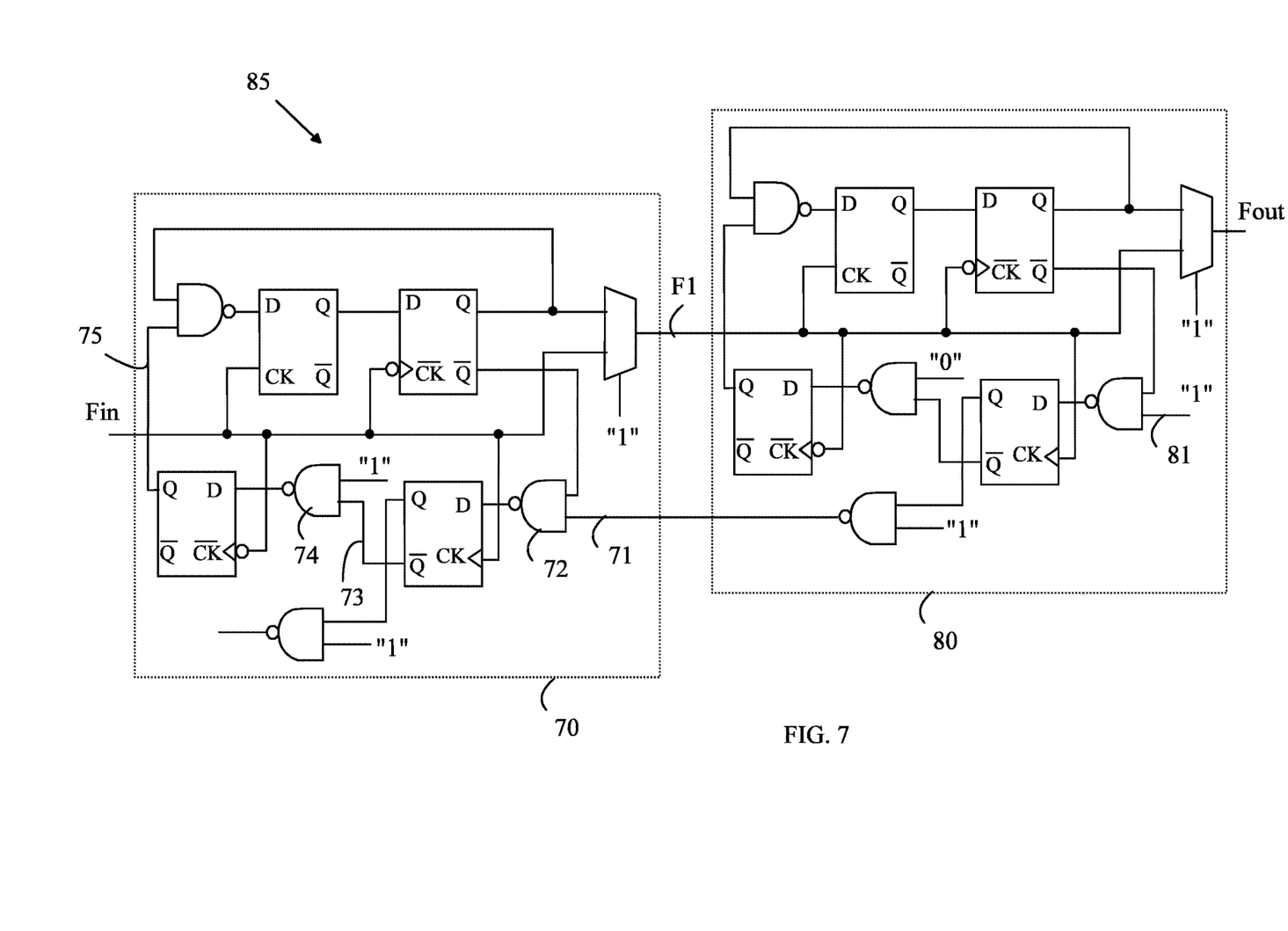
FIG. 7 is a schematic drawing of the two-module divide-by-five circuit.

The manner in which the $MOD_{in}$-$MOD_{out}$ chain provides this feature can be more easily understood with respect to a specific example. Consider the case in which $N_{div}=5$. This case only requires two modules in series. If more than two are present, the higher modules are set to divide-by-one mode and the $MOD_{in}$ ports on these modules are connected to $V_{DD}$ or whatever potential corresponds to logical ONE. Refer now to FIG. 7, which is a schematic drawing of the two-module divide-by-five circuit. Divide-by-five circuit 85 is constructed from two modules of the type discussed above with reference to FIG. 4. Module 70 is configured as a divide-by-three module and module 80 is configured as a divide-by-two module. The $MOD_{in}$ input 81 of module 80 is connected to logical one and the $MOD_{in}$ input of module 70 is connected to the $MOD_{out}$ of module 80.

Figure 8:
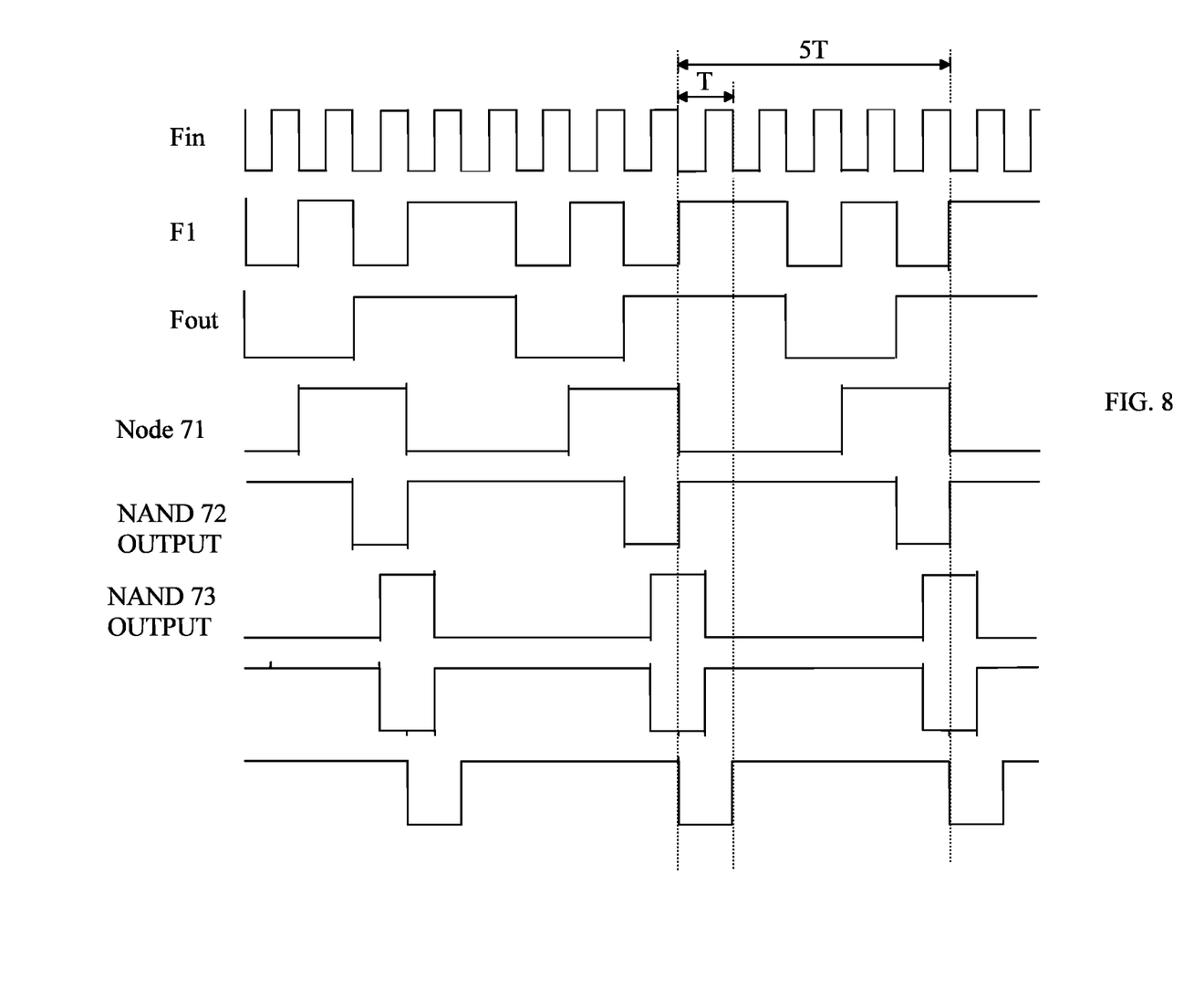
FIG. 8 illustrates the wave patterns at various locations in module 70 and module 80.

Refer now to FIG. 8, which illustrates the wave patterns at various locations in module 70 and module 80. The input to divide-by-five circuit 85, $F_{in}$, consists of a clock signal having a period of T. As noted above, embodiments in which the flip-flops trigger either on the rising edge or falling edge of the clock signal can be constructed. In the above-examples, the flip-flops are triggered on the rising edge. In this example, the flip-flops trigger on the falling edge.

The difference between a divide-by-three operation and a divide-by-two operation is the insertion of an extra high period when the F1 is high and node 75 is low as shown at 85 in FIG. 8. The potential on node 75 is determined by the potential on the node 71, one period of $F_{in}$ prior to the start of the cycle. As can be seen from FIG. 8, this condition only occurs once in every five periods of $F_{in}$. Hence, the divide-by-three mode is only enabled once per period of the output period.

While the above-described embodiments utilize a specific form of module, other forms of modules could be used in the module string. For the purposes of this disclosure, a "module string" is defined to be a series connected string of modules in which each module has a frequency input port adapted to receive an input binary signal, a frequency output port adapted to transmit an output binary signal, a module control port adapted to receive configuration signals that specify one of three modes for that module, a module output port adapted to transmit a module output signal; and a module input port adapted to receive a module input signal. The frequency output port of module k is connected to said frequency input port of module k+1, for k=1 to N, where N is the number of modules in said string of modules.

The above-described embodiments of the integer divider circuit and method have been provided to illustrate various aspects of the integer divider circuit and method. However, it is to be understood that different aspects of the integer divider and method that are shown in different specific embodiments can be combined to provide other embodiments of the integer divider and method. In addition, various modifications will become apparent from the foregoing description and accompanying drawings. Accordingly, the integer divider and method are to be limited solely by the scope of the following claims.

What is claimed is:

1. A frequency divider comprising
a circuit that receives an input clock signal having a period T on an input port thereof and generates an output clock signal on an output port thereof having a period MT in response to a control signal specifying M, wherein M is a positive integer and all transitions between logical one and logical zero in said output clock signal occur at integer multiples of T; and
a plurality of modules in the circuit, wherein the modules are substantially identical and connected in series, having a first module, and a last module, and N>1, wherein N is a number of the modules;
wherein each of the modules includes a module input clock port, a module output clock port, a module division control port, and an inter-module input port; and
wherein each of the modules is configured such that when the input clock signal having period T is input to the first module, the output clock signal having a period of MT is output from the last module, wherein M has a minimum value of 1 and a maximum number dependent upon N.

2. The frequency divider of claim 1 wherein said maximum number is $2^N$.

3. The frequency divider of claim 1 wherein each module, when not connected to another one of said modules, performs a frequency division of one, two, or three, depending on an input to said module division control port of that module, said module input clock port being shorted to said module output clock port of that module when said module division control port of that module receives an input indicating a division by one is to occur.

4. The frequency divider of claim 3 wherein said module performs a frequency division of three if said module division control port of that module receives an input indicating a division by three and said inter-module input port of said module is connected to a predetermined constant potential.

5. The frequency divider of claim 1 further comprising a controller that generates and couples a module division control port input signal to each of said modules in response to a configuration input that specifies a value for M.

6. The frequency divider of claim 1 wherein each module is configured such that any module that receives a control division port input indicating of a division by three when an input signal to that module has a period, t, can only provide an output signal having period of 3t once in every MT cycles.

7. A method for operating a frequency division circuit characterized by an input port and an output port, said method comprising:
    receiving an input clock signal having a period T on said input port;
    receiving a control signal specifying M, wherein M is a positive integer; and
    generating an output clock signal on said output port having a period MT in which all transitions between logical one and logical zero in said output clock signal occur at integer multiples of T;
    wherein said circuit comprises a module string having a plurality of identical modules, characterized by N number of modules in the module string, the modules connected in series having a first module, a last module, and N>1;
    wherein each of the modules includes a module input clock port, a module output clock port, a module division control port, and an inter-module input port; and
    wherein each of the modules is configured such that when said input clock signal having period T is input to said first module, said output clock signal having a period of MT is output from said last module, where M has a minimum value of 1.

8. A frequency divider, comprising:
    a circuit that receives an input clock signal having a period T on an input port thereof and generates an output clock signal on an output port thereof having a period MT in response to a control signal specifying M, wherein M is a positive integer and all transitions between logical one and logical zero in said output clock signal occur at integer multiples of T;
    wherein said circuit comprises a module string of a plurality of identical modules, characterized by N number of modules, connected in series having a first module, a last module, and wherein N>1;
    wherein each of the modules includes a module input clock port, a module output clock port, a module division control port, and an inter-module input port;
    wherein each of the modules is configured such that when said input clock signal having period T is input to said first module, said output clock signal having a period of MT is output from said last module, where M can have any value between 1 and a maximum number that depends on N; and
    wherein when an unconnected module that is not connected to another of said modules, performs a frequency division of one, two, or three, depending on an input to said module division control port, said module input clock port being shorted to said module output clock port when said module division control port receives an input indicating a division by one is to occur.

9. The frequency divider of claim 8 wherein said unconnected module performs a frequency division of three if said module division control port receives an input indicating a division by three and said inter-module input port is connected to a predetermined constant potential.

10. The frequency divider of claim 8 wherein M can have any value between said minimum value of 1 and a maximum number that depends on N.

* * * * *